United States Patent [19]

Nagahama

[11] 3,959,743
[45] May 25, 1976

[54] LINEAR VOLTAGE-CONTROLLED SAW-TOOTH OSCILLATOR

[75] Inventor: Yasuo Nagahama, Hamamatsu, Japan

[73] Assignee: Nippon Gakki Seizo Kabushiki Kaisha, Japan

[22] Filed: May 27, 1975

[21] Appl. No.: 581,185

[30] Foreign Application Priority Data
May 29, 1974 Japan............................ 49-62351[U]

[52] U.S. Cl............................. 331/111; 331/177 R
[51] Int. Cl.² ........................................... H03K 4/50
[58] Field of Search................. 331/111, 177 R, 143

[56] References Cited
UNITED STATES PATENTS

| | | | |
|---|---|---|---|
| 3,621,469 | 11/1971 | Bauer.................................. | 331/111 |
| 3,694,772 | 9/1972 | Sordello............................... | 331/111 |
| 3,824,494 | 7/1974 | Wilcox........................ | 331/177 R X |

Primary Examiner—Siegfried H. Grimm
Attorney, Agent, or Firm—Ladas, Parry, Von Gehr, Goldsmith & Deschamps

[57] ABSTRACT

In the inventive voltage-controlled oscillator, relationship between an input control voltage and an output oscillation frequency is made substantially linear by utilization of charging and discharging operations of a capacitor. The capacitor is charged with a constant current value of which is dependent upon the value of the control voltage, and the capacitor is being discharged when the charging voltage has reached a predetermined level. The charging level of the capacitor is variable and it drops as the oscillation frequency increases. This is achieved by providing a low-pass filter between the capacitor and a voltage source. According to this arrangement, as the frequency increases, the voltage applied to the capacitor equivalently decreases, whereby a discharging period of the capacitor is shortened and linearity in the relationship between the input control voltage and the output oscillation frequency is obtained.

1 Claim, 3 Drawing Figures

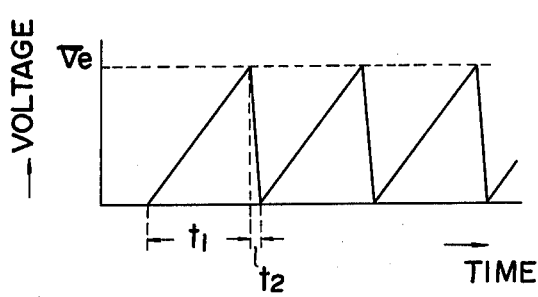
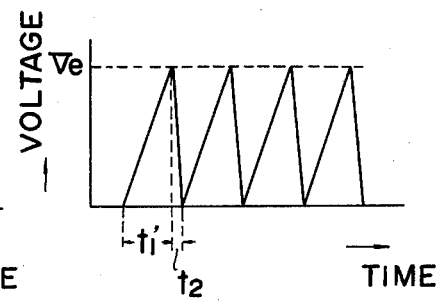
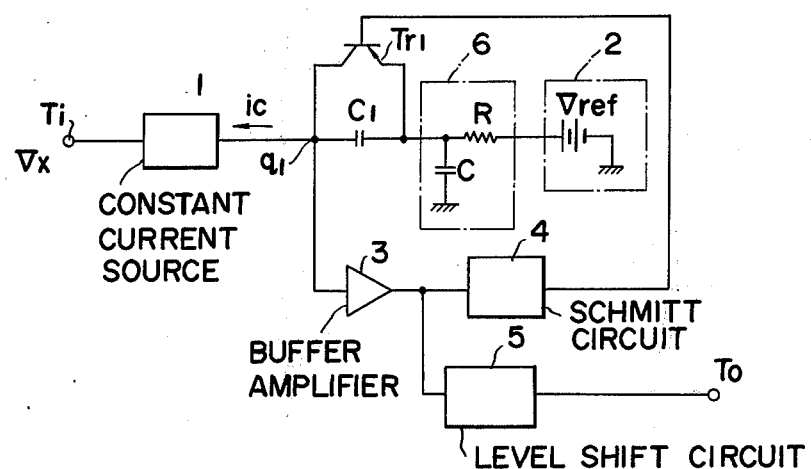

LINEAR VOLTAGE-CONTROLLED SAW-TOOTH OSCILLATOR

This invention relates to an improvement in a voltage-controlled oscillator.

In a voltage-controlled oscillator, a capacitor is charged through a constant current source which is controlled by a control voltage and discharges upon reaching a predetermined charging potential resulting in oscillation of a saw-tooth wave signal corresponding in frequency to the control voltage. According to this type of oscillator, the frequency of oscillation can be varied over a relatively wide range by changing the input control voltage. The oscillation frequency is dependent upon the value of the constant current controlled by the control voltage. Strictly speaking, however, what is determined by the value of the constant current is a period of time $t_1$ during which the capacitor is charged and one period of the oscillation frequency is a sum of this charging period $t_1$ and a period of time $t_2$ during which the capacitor discharges, as illustrated in FIG. 1(a). It will be noted from FIG. 1(b) that only a charging period $t_1'$ changes when the oscillation frequency changes and the discharging period $t_2$ remains unchanged because the amount of electric charge $CVe$ of the charged capacitor does not change (the amplitude of the saw-tooth wave does not change). Accordingly, as frequency increases (i.e. as the charging period decreases), linearity of relationship between the output oscillation frequency and the input control voltage is increasingly impaired.

It is, therefore, an object of the invention to provide an improved voltage-controlled oscillator in which the output oscillation frequency is maintained in substantially linear relationship to the input control voltage. According to the invention, a low-pass filter circuit comprising a resistor and a capacitor is connected between an oscillation capacitor and a voltage source for supplying voltage to this oscillation capacitor, whereby the voltage applied to the oscillation capacitor decreases as the oscillation frequency increases, and, accordingly, the amplitude of the oscillated saw-tooth wave frequency decreases with a resultant improvement in linearity of the relationship between the output oscillation frequency and the input control voltage.

A preferred embodiment of the invention will now be described with reference to the accompanying drawing in which:

FIGS. 1(a) and (b) are diagrams showing examples of output waveshapes of the prior art voltage-controlled oscillator; and FIG. 2 is a block diagram showing the circuit construction of the preferred embodiment of the inventive voltage-controlled oscillator.

Referring to FIG. 2, when a control voltage $V_x$ is applied to an input terminal $Ti$ of a constant current source 1, a constant current $i_c$ flows through the constant current source 1. This constant current $i_c$ is controlled by the control voltage $V_x$ (i.e. varying in proportion to the control voltage $V_x$ or a function of the control voltage $V_x$). Accordingly, the constant current $i_c$ flows from a voltage source 2 through an oscillation capacitor $C_1$ charging this capacitor $C_1$. Voltage across the capacitor $C_1$ rises in proportion to a period of time during which the capacitor $C_1$ is charged. The inclination representing the voltage increase is linear because the capacitor is charged with a constant current. The voltage change at a point $q_1$ which is at one end of the capacitor $C_1$ is of an inclination in a negative direction and this voltage at the point $q_1$ is applied to a buffer amplifier 3 and thence to a Schmitt circuit 4 and a level shift circuit 5. The buffer amplifier 3 may be composed of an impedance transforming circuit comprising, for example, a field-effect transistor.

When the voltage at the point $q_1$ drops to a level at which the output of the buffer amplifier 3 brings an input transistor (not shown) of the Schmitt circuit 4 out of conduction, the output transistor (not shown) of the Schmitt circuit 4 conducts thereby causing the Schmitt circuit 4 to produce a pulse of the negative direction. This output pulse is applied to the base of a pnp transistor $Tr_1$ connected in parallel to the oscillation capacitor $C_1$ and the transistor $Tr_1$ thereby becomes conductive. This causes the capacitor $C_1$ to discharge in a short period of time. Upon completion of discharging, the capacitor $C_1$ starts to be charged again. The charging and discharging of the capacitor $C_1$ are repeated and a saw-tooth wave signal is oscillated from an output terminal $T_o$. The level shift circuit 5 which is provided for shifting the d-c level of the saw-tooth wave signal functions to produce from the terminal $T_o$ a saw-tooth wave which oscillates in the positive and negative directions from the ground potential.

Since the oscillation frequency is determined by the capacity of the capacitor $C_1$ which is constant and the value of the constant current $i_c$, the oscillation frequency varies with the value of the constant current $i_c$, i.e. the value of the control voltage $V_x$.

A low-pass filter circuit 6 composed of a resistor R and a capacitor C is connected between the oscillation capacitor $C_1$ and the voltage source 2. The constant current $i_c$ flows from the voltage source 2 through the low-pass filter circuit 6 and the oscillation capacitor $C_1$. The cyclic variation in voltage due to the charging and discharging of the capacitor $C_1$ (i.e. the oscillation frequency) causes the output voltage of the low-pass filter circuit 6 to vary accordingly and this output voltage becomes an equivalent power source for the oscillation capacitor $C_1$. If the oscillation frequency is low, reactance of the capacitor C of the low-pass filter circuit 6 is large and, accordingly, voltage Vref of the voltage source 2 is developed at the output terminal of the low-pass filter circuit 6 without any modification. In this case, the saw-tooth wave signal is oscillated with a normal amplitude. If, on the other hand, the oscillation frequency increases beyond the cut-off frequency of the filter circuit 6, output impedance of the filter circuit 6 drops and the voltage applied to the oscillation capacitor $C_1$ drops accordingly. This causes the amplitude of the saw-tooth wave to decrease with a result that the fall time of the saw-tooth wave, i.e. the discharging time $t_2$ described above, is shortened. The higher the oscillation frequency, the shorter becomes the discharging time $t_2$. Consequently, linearity of the input control voltage $V_x$ or constant current $i_c$ relative to the output oscillation frequency is remarkably improved. It will be understood that the cut-off frequency of the low-pass filter circuit 6 should be suitably determined within a frequency range in which linearity would not be impaired by the operation of the oscillator which would be performed if the low-pass filter circuit 6 was not provided in the oscillator.

What is claimed is:

1. In a voltage-controlled oscillator for oscillating a saw-tooth wave signal of a frequency corresponding to an input control voltage comprising a voltage source for charging a capacitor, a constant current control circuit for controlling a charging current to become a value corresponding to the input control voltage, and discharging means for causing the capacitor to discharge by short-circuiting upon detection of voltage across the charged capacitor when the voltage has reached a predetermined value, the voltage variation caused by the charging and discharging of the capacitor being output from the oscillator as the saw-tooth wave signal, an improvement comprising additionally a low-pass filter circuit connected between the voltage source and the capacitor for making relationship between the input control voltage and the output oscillation frequency substantially linear.

* * * * *